United States Patent
Eyring et al.

(10) Patent No.: US 9,704,238 B2
(45) Date of Patent: *Jul. 11, 2017

(54) METHOD FOR CORRECTING POSITION MEASUREMENTS FOR OPTICAL ERRORS AND METHOD FOR DETERMINING MASK WRITER ERRORS

(71) Applicant: KLA-Tencor Corporation, Milpitas, CA (US)

(72) Inventors: Stefan Eyring, Weilburg (DE); Oliver Ache, Leun (DE); Frank Laske, Weilmuenster (DE)

(73) Assignee: KLA-Tencor Corporation, Milpitas, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 14/950,546

(22) Filed: Nov. 24, 2015

(65) Prior Publication Data

US 2016/0078609 A1    Mar. 17, 2016

Related U.S. Application Data

(63) Continuation of application No. 14/302,708, filed on Jun. 12, 2014, now Pat. No. 9,201,312, which is a (Continued)

(51) Int. Cl.
*G06K 9/00* (2006.01)
*G06T 7/00* (2017.01)
(Continued)

(52) U.S. Cl.
CPC ............ *G06T 7/001* (2013.01); *G03F 1/44* (2013.01); *G03F 1/84* (2013.01); *G03F 7/70633* (2013.01);
(Continued)

(58) Field of Classification Search
CPC ............ G06T 7/0004; G06T 7/001; G06T 2207/10061; G06T 2207/30148;
(Continued)

(56) References Cited

U.S. PATENT DOCUMENTS

| | | | |
|---|---|---|---|
| 6,806,899 B1 * | 10/2004 | Schaack | G02B 23/2407 348/65 |
| 9,201,312 B2 * | 12/2015 | Eyring | G03F 7/70633 |

(Continued)

FOREIGN PATENT DOCUMENTS

| | | |
|---|---|---|
| DE | 102008060293 A | 6/2010 |
| JP | 2001349848 A | 12/2001 |
| JP | 2006266864 A | 10/2006 |

*Primary Examiner* — Samir Ahmed
(74) *Attorney, Agent, or Firm* — Simpson & Simpson, PLLC (57) ABSTRACT

A method for correcting optical errors occurring in coordinates of positions of a plurality of targets measured via an imaging system comprising a field of view. The plurality of targets includes a first array of targets and a second array of targets overlapping the first array of targets, and a portion of the plurality of targets are outside of the field of view. The method broadly includes the following steps: a) placing the first array of targets in the field of view of the imaging system; b) measuring coordinates of each target within the first array of targets repeatedly via the imaging system; c) placing the second array of targets in the field of view of the imaging system; d) measuring coordinates of each target within the second array of targets repeatedly via the imaging system; e) determining an alignment function from the measurement results of step b, step d, or steps b and d, the alignment function being a function of coordinates of the field of view of the imaging system and giving an additive correction for optical errors of the coordinates of positions of the plurality of targets measured by the imaging system; f) correcting the coordinates of the positions of the plurality (Continued)

of targets measured by the imaging system by adding the respective value of the alignment function at the field-of-view coordinates at which the coordinates of the position of the respective target were measured; and, g) obtaining a final result for the position of each target of the plurality of targets by averaging over the corrected coordinates found in step f for the respective target at each relative position of the plurality of targets and field of view of the imaging system.

25 Claims, 6 Drawing Sheets

Related U.S. Application Data continuation of application No. PCT/US2014/034391, filed on Apr. 16, 2014.

(60) Provisional application No. 61/812,377, filed on Apr. 16, 2013.

(51) Int. Cl.
| | | |
|---|---|---|
| *G03F 7/20* | (2006.01) | |
| *G06K 9/52* | (2006.01) | |
| *G03F 1/44* | (2012.01) | |
| *G03F 1/84* | (2012.01) | |
| *G06T 7/33* | (2017.01) | |
| *G06T 7/73* | (2017.01) | |
| *G06T 7/246* | (2017.01) | |
| *G06T 7/62* | (2017.01) | |

(52) U.S. Cl.
CPC ............... *G06K 9/52* (2013.01); *G06T 7/248* (2017.01); *G06T 7/337* (2017.01); *G06T 7/62* (2017.01); *G06T 7/74* (2017.01); *G06T 2207/30148* (2013.01)

(58) Field of Classification Search
CPC . G06T 2207/30141; G06T 2207/30152; G06T 7/003; G06T 7/0044; G03F 7/70633; G03F 1/84; G03F 1/44; G01N 21/9501; G06K 9/52
See application file for complete search history.

(56) References Cited

U.S. PATENT DOCUMENTS

| | | | |
|---|---|---|---|
| 2002/0006561 A1* | 1/2002 | Taniguchi | ........... G03F 7/70258 430/22 |
| 2008/0144047 A1* | 6/2008 | Hayashi | ............... G03F 9/7003 356/620 |
| 2011/0225554 A1 | 9/2011 | Laske et al. | |
| 2011/0229010 A1* | 9/2011 | Arnz | ..................... B82Y 10/00 382/144 |

\* cited by examiner

Prior art

METHOD FOR CORRECTING POSITION MEASUREMENTS FOR OPTICAL ERRORS AND METHOD FOR DETERMINING MASK WRITER ERRORS

CROSS-REFERENCE TO RELATED APPLICATIONS

This application is a Continuation of U.S. patent application Ser. No. 14/302,708, filed on Jun. 12, 2014, which application is a Continuation of International Patent Application Serial No. PCT/US2014/034391, filed on Apr. 16, 2014, which application claims priority of U.S. Provisional Patent Application No. 61/812,377, filed on Apr. 16, 2013, which applications are incorporated herein by reference in their entireties.

FIELD OF THE INVENTION

The present invention refers to methods for correcting position measurements of targets, in particular to methods for correcting errors in position measurements that are due to optical distortions across the field of view of an imaging system used in a position measurement system. The present invention also relates to methods using correspondingly corrected position measurements to identify errors in the manufacture of photolithography masks.

BACKGROUND OF THE INVENTION

Position measurements of targets, in particular of structures on substrates in semiconductor manufacturing, are subject to various types of errors. Precise determination of the position of structures is important to assure that, ultimately, correctly functioning semiconductor products, like computer chips, for example, are produced. The demands with respect to precision increase as the structure dimensions on the chips to be produced decrease.

An important aspect of position measurements in the above context is registration of structures or sections of a structured surface with respect to each other. Errors of registration on a mask as determined by a measurement with a typical optical metrology tool, of which KLA-Tencor's LMS IPRO 5 is a contemporary example, may for example be due to errors in the optical metrology tool or to errors in the mask writer. By eliminating or reducing the errors occurring in the measurement with the optical metrology tool, the errors due to the mask writer can be identified.

For example, German Patent Application Publication No. DE 10 2008 060 293 A1 and United States Patent Application Publication No. US 2011/0229010 A1 disclose a method for determining relative positioning errors of plural sections of structures written on a substrate like a wafer or a photolithography mask. One magnified image of a region of the substrate larger than one section is recorded. Position errors of measurement marks contained in the image are determined from the image. The position errors are corrected for errors due to the imaging process. From the position errors corrected in this way the relative position error of the section is derived. This relative position error of a section is also known as stitching error, and the method assumes that errors due to the imaging process produce low frequency errors, whereas the stitching errors produce high frequency errors. Therefore, in order to remove the imaging errors, the low frequency error components are removed by a high-pass filtering process.

Another approach is to measure each target in an array of targets, for example each structure of interest in an arrangement of structures on an surface of a semiconductor substrate, individually, by moving the respective target into the center of the field of view of an imaging system of an optical metrology tool and performing the measurement.

The multi-region-of-interest registration measurement is a further approach. This makes use of the fact that often many targets are simultaneously contained in the field of view of an imaging system of an optical metrology tool. So the positions of plural targets, located at different positions relative to the field of view, can be measured at the same time.

However, the assumption made in the prior art about the mask writer having only high frequency errors is not strictly correct. By the high-pass filtering process information on the low frequency mask writer error therefore is discarded. In the case of individual target measurements, the throughput is very low. For example, on an IPRO4 metrology tool, measuring a single target may take up to 12 seconds, and measuring a typical array then up to 7 hours. During this long period of time, drift errors of the metrology tool can occur, which reduce the precision of the results.

In the multi-region-of-interest approach, due to optical distortion and aberrations which depend on the position in the field of view, different registration results may be produced if an array of targets like a mask with structures is shifted relative to the field of view and the position, relative to the array, or mask, respectively, coordinate system is determined for each shifted position. This error, depending on the field-of-view coordinates and also referred to as field-varying error, limits the achievable precision of registration measurements.

The optical error, like for example the optical distortion and/or aberrations, depends on the optical setup of the imaging system, but may also depend on parameters of the measured targets/structures, like size or symmetry of the targets or on proximity of two or more targets. The optical error can further depend on the substrate on which an array of targets is provided in specific technical fields, like in the case of wafers or masks in semiconductor manufacturing. There, the optical error can for example depend on the coatings, layer design or layer thickness of a mask.

BRIEF SUMMARY OF THE INVENTION

It therefore is an object of the invention to provide a method for correcting optical errors occurring in position measurements of targets in a field of view of an imaging system, wherein the measurement can be carried out fast, variably and reliably.

This object is achieved by a method comprising the following steps:
a) placing an array of targets in a field of view of the imaging system, wherein a plurality of targets of the array of targets are within the field of view of the imaging system and wherein the relative positions of targets within the array of targets are fixed;
b) measuring the coordinates of the plurality of the targets of the array of targets repeatedly via the imaging system, wherein the array of targets is shifted relative to the field of view of the imaging system between the repeated measurements;
c) determining an alignment function from the measurement results of step b, the alignment function being a function of coordinates of the field of view of the imaging system and giving an additive correction for optical errors of the coordinates of positions of targets measured by the imaging system; and, d) correcting the coordinates of the positions of the targets measured by the imaging system by adding the respective value of the alignment function at the field-of-view coordinates at which the coordinates of the position of the respective target were measured.

It is a further object of the invention to provide a method for detecting photolithography mask writer errors wherein the measurement can be carried out fast, variably and reliably.

This object is achieved by a method comprising the following steps:

a) placing a mask in a field of view of an imaging system of a metrology tool, wherein a plurality of structures on the mask are within the field of view of the imaging system;

b) measuring the coordinates of the plurality of structures on the mask repeatedly with the metrology tool, wherein the mask is shifted relative to the field of view of the imaging system between the repeated measurements;

c) determining an alignment function for the imaging system from the measurement results of step b, the alignment function being a function of coordinates of the field of view of the imaging system and giving an additive correction for optical errors in the coordinates of the positions of structures measured by the mask metrology tool;

d) correcting, for each structure of the plurality of structures and for each shift of the mask relative to the field of view of the imaging system, the measured position of the respective structure in a mask coordinate system according to the alignment function;

e) obtaining a final result for the position in the mask coordinate system of each structure of the plurality of structures by averaging over the corrected measured positions in the mask coordinate system found in step d for the respective structure at each relative position of mask and field of view of the imaging system; and, f) inferring mask writer errors from a comparison between the final results for the positions obtained in step e and design data for the mask measured.

According to the inventive method for correcting optical errors in coordinates of positions of targets measured via an imaging system, first an array of targets is placed within the field of view of the imaging system. It should be noted that in the context of this application, "target" refers to any object or element the position of which is to be measured via the mentioned imaging system. A target may for example be a structure on a surface of a semiconductor substrate or on a photolithography mask, but the inventive method is not limited to these examples. The relative positions of the targets within the array of targets are fixed; or, put differently; with respect to a coordinate system relative to the array of targets the true values of the coordinates of the targets are constant. It is important for the method that a plurality of targets of the array of targets is within the field of view.

Next, the array of targets is shifted to different relative positions with respect to the field of view, and for each such relative position the coordinates of the plurality of targets are measured via the imaging system. Depending on the nature of the target, methods to measure the coordinates of a target are known, which includes in particular also a definition of what is to be understood as position of a target in the case of spatially extended targets like lines on a wafer for example. In embodiments the imaging system creates an image of the field of view on a detector, which, usually electronically, records the image and makes the image available for evaluation, which in particular includes measuring positions of targets by known methods. The field of view and the array of targets are two-dimensional, therefore the positions of targets, regardless whether relative to the field of view of relative to the array of targets, are specified by two real numbers, typically referred to as x- and y-coordinate of the respective target. The shifts are also specified by two coordinates.

It is pointed out that as the relative shift between the array of targets and the field of view is known, the relation between coordinates relative to the field of view and coordinates relative to a coordinate system of the array of targets is also known.

Then an alignment function is determined from the coordinates measured in the preceding step, i.e. from the coordinates obtained for the targets of the plurality of targets at each relative position of the array of targets and the field of view. The alignment function is a function of coordinates of the field of view of the imaging system and gives an additive correction for optical errors of the coordinates of positions of targets measured by the imaging system. This alignment function is then used to correct the coordinates of the positions of the targets measured by the imaging system. This is done by adding the value of the alignment function at the respective field-of-view coordinates at which the coordinates of the position of each respective target were measured to the measured coordinates. In particular, in this way corrected coordinate values relative to the array of targets can be obtained.

As the positions of the targets relative to the array of targets are fixed, any changes in the measured results of the coordinates of targets, relative to the array of targets, are due to optical errors like distortion or aberrations. In this way the inventive method achieves a splitting of the sources of error, separating optical errors from different types of error like placement errors of targets introduced when assembling the array of targets. The fact that a plurality of targets are in the field of view not only increases the throughput, but also allows identifying changes in measured relative positions of targets when comparing measurement results obtained at different relative positions of the array of targets and the field of view. Such changes can be attributed to optical errors, as positioning errors of the array of targets when shifting the array of targets to different relative positions with respect to the field of view cannot affect the relative positions of targets within the array.

As for any target of the plurality of targets corrected coordinate values relative to the array of targets are obtained by the method described so far for each relative position of the array of targets and the field of view at which the coordinates of the respective target have been measured, in embodiments a final result for the coordinates relative to the array of targets of the respective target is determined by averaging over the results obtained at the different relative positions of the array of targets and the field of view for the coordinates of the position relative to the array of targets of the respective target.

As has been said, for each relative position of the array of targets and the field of view corrected values of the coordinates of its position, relative to the array of targets, can be obtained for each target. In embodiments of the method the alignment function is determined in such a way that the variation of these corrected values, for the entirety of targets, is minimized. The reason for this approach is that in the ideal case, where there are no optical distortions or aberrations, the result of the position of a specific target relative to the array of targets should be independent of the position in the field of view at which the former position was measured, i.e. the position measurement relative to the array of targets should not depend on the relative position of the array of targets and the field of view. The variation for each coordinate is always considered a non-negative value, it may for example be the absolute value of the changes obtained, the square of the changes, or the statistical variance. Then, for example, the variations for all the targets may be summed, or an average variation over the targets may be used, for the step of minimizing the variation.

In specific embodiments the alignment function is determined by expressing the alignment function as a linear combination of functions, wherein the coefficients of the linear combination are determined such that the aforementioned variation of coordinates relative to the array of targets is minimized. Typical functions used for building the linear combination are polynomials up to a specified degree, cosine and/or sine functions, Chebyshev or Zernike polynomials. It is known to the skilled person that the true or ideal alignment function, i.e. the alignment function which would fully remove any error due to optical distortion or aberrations, is approximated by the linear combination the better the more functions are used therein, for example the higher the maximum degree of the polynomials used or the higher the maximum order of the cosine/sine functions used is. Of course, the skilled person is not limited to the examples of functions provided. Advantageously functions can be used that are adapted to the expected symmetry properties of the optical errors. Due to the two-dimensional nature of this fitting problem, each term of the linear combination is to be regarded as a function of two coordinates; such a function may, however, be written as a product of two functions of one coordinate each, of which, in special cases, at least one may be a constant function.

In embodiments of the method the array of targets covers an area smaller than the field of view of the imaging system. In such a case, all the targets of the array may have their coordinates measured when performing the method. In particular, the shifts of the relative position of the array of targets and the field of view in embodiments are such that the total coverage of the area of the field of view achieved over the shifts exceeds 85% of the area of the field of view. In specific embodiments, full coverage of the field of view, i.e. 100% coverage, is achieved. The shifts used, and thus the relative positions between the array of targets and the field of view, may be chosen such that the different required relative positions can be assumed in a short time or according to any other criterion of import to a user of the method. An optimized sequence of shifts, taking into account the geometry of the field of view and the geometry of the array of targets may be determined prior to the start of the position measurements by a pre-processing step.

In alternative embodiments the array of targets covers an area larger than the field of view of the imaging system. Here, too, all the targets in the array of targets may have their positions measured for performing the method. A large number of targets usually provides better statistics and a more reliable determination or better approximation of the alignment function. It is, however, also possible to use only a subset of the targets of the array of targets for performing the method. If the array of targets covers an area larger than the field of view, the plurality of targets having their positions measured at different relative positions of the array of targets and the field of view may not comprise identical targets for each relative position. In order to provide useful results, for each target the position of which is measured when carrying out the inventive method the position needs to be measured at more than one relative position of the array of targets and the field of view.

In embodiments the array of targets is an arrangement of structures on a substrate. Such a substrate may for example be a semiconductor wafer, and the structures are the structures created on the surface of the wafer by the known methods of wafer manufacturing. In an alternative embodiment, the array of targets is given by the structures exhibited by a photolithography mask.

In a particularly advantageous embodiment, the array of targets constitutes a test pattern specifically designed for establishing the alignment function. Such a test pattern, in the case of structures on a wafer, may for example be composed of holes or contacts which are at the low end of the size scale of structures typically measured for such wafers.

In embodiments, the measurement of the coordinates of the plurality of targets for each relative position of the field of view and the array of targets is repeated several times. This results in a higher number of measurement values for the coordinates of the positions of the targets than if the measurement for the various relative positions of the field of view and the array of targets is only done once. Using this higher number of measurement values in the determination of the alignment function, where the alignment function is determined along the lines described above, results in a higher precision of the resulting alignment function.

The inventive method for detecting photolithography mask writer errors starts by placing a mask in a field of view of an imaging system of a metrology tool, wherein a plurality of structures on the mask are within the field of view of the imaging system. The structures on the mask here correspond to the array of targets in the method described above.

Next, the coordinates of the plurality of structures on the mask are measured repeatedly with the metrology tool, wherein the mask is shifted relative to the field of view of the imaging system between the repeated measurements. As in the method described above, the coordinates of the position of a structure on the mask are given by two real numbers. As the shifts of the mask and the positions of the structures in the field of view are known after the respective measurement, the coordinates of the structures relative to the mask, i.e. in a mask coordinate system, are also known.

From the measurement results of the preceding step an alignment function for the imaging system is determined, the alignment function being a function of coordinates of a field of view of the imaging system and giving an additive correction for optical errors in the coordinates of the positions of structures measured by the metrology tool.

An alignment function, once obtained along the lines described above, can be stored for later use. Position measurements of targets can be corrected with a stored alignment function, where the stored alignment function was not derived from measurements of the positions of the targets that are to be corrected with it. Such position measurements can be started when required, i.e. the full measurement of an array of targets can be performed when needed, or coordinates of targets may be derived from images recorded with the imaging system at an earlier time, where such images have been stored for later use.

The alignment function is then used to correct, for each structure of the plurality of structures and for each shift of the mask relative to the field of view of the imaging system, the measured position of the respective structure in a mask coordinate system.

A final result for the position in the mask coordinate system of each respective structure of the plurality of structures is then obtained by averaging over the positions in the mask coordinate system found for the respective structure at each relative position of mask and field of view of the imaging system.

As the optical errors introduced by the imaging system of the metrology tool are removed or at least suppressed by correcting the measured coordinate values with the alignment function, a comparison of these corrected values with the design data of the mask allows identifying errors due to the mask writer. In particular, a registration map for the mask writer may be established, showing registration errors of the mask writer over the surface of the mask.

As the structures on the mask are at fixed relative positions to each other, any errors regarding the placement of structures on the mask during the production of the mask are identical at each relative position of the mask and the field of view. Changes in the measured positions of the structures on the mask then are due to errors in the imaging system, i.e. optical errors like optical distortion and/or aberrations. By the inventive method it is therefore possible to remove or strongly suppress the optical error, without having to rely on assumptions about optical errors being low frequency and mask writer errors being high frequency errors. Especially, also low frequency mask writer errors may be detected. Such low frequency mask writer errors include, but are not limited to, rotation errors, magnification errors and orthogonality errors.

As the positions of a plurality of structures in the field of view can be measured simultaneously, the throughput is higher than in many prior art methods, with the additional advantage that the optical error, or field-varying error as mentioned in the context of the prior art multi-region-of-interest approach, is suppressed or removed. The simultaneous measurement of the positions of a plurality of targets tends to reduce the effect of noise on the measurement results, as the simultaneous measurements of the plurality of targets is likely to be affected in an equal manner by the noise, which implies an at least partial compensation of the noise effects, for example when relative positions of structures are required. This leads to a reduction of the total measurement uncertainty.

In specific embodiments the mask exhibits mask writer qualification patterns, which may be holes, lines or further structures at the small end of the size scale of structures occurring on the mask.

In analogy to the case of the method described before in the context of general arrays of targets, here the alignment function is determined in such a way that the variation of the positions of the structures relative to the mask between the repeated measurements at different relative positions of the mask and the field of view is minimized when these positions are first corrected by the alignment function. In specific embodiments the alignment function is determined by expressing the alignment function as a linear combination of functions, the coefficients of the linear combination being determined in such a way that the variation of the positions of the structures relative to the mask between the repeated measurements is minimized when these positions are first corrected by the alignment function. For further details on the linear combination we refer to the above statements in the context of the method referring to the general array of targets.

In embodiments, the plurality of structures covers an area smaller than the field of view of the imaging system. In particular embodiments the shifts of the mask are such that the total area covered by the plurality of structures over the course of the shifts is more than 85% of the area of the field of view. The coverage of the field of view may in particular reach 100%.

In different embodiments the structures cover an area larger than the field of view of the imaging system. Statements analogous to the previously described method referring to the array of targets apply.

BRIEF DESCRIPTION OF THE DRAWINGS

Below the invention and its advantages will be further described with reference to the accompanying schematic drawings. These drawings refer specifically to the case that the array of targets is a plurality of structures on a surface of a mask and the imaging system is the imaging system of a metrology tool. Nonetheless the figures can also illustrate the steps of the method referring to a more general array of targets.

DETAILED DESCRIPTION OF THE INVENTION

In the figures like reference numerals are used for like elements or elements of like function. Furthermore, for the sake of clarity, only those reference numerals are shown in the figures which are necessary for discussing the respective figure.

Figure 1:
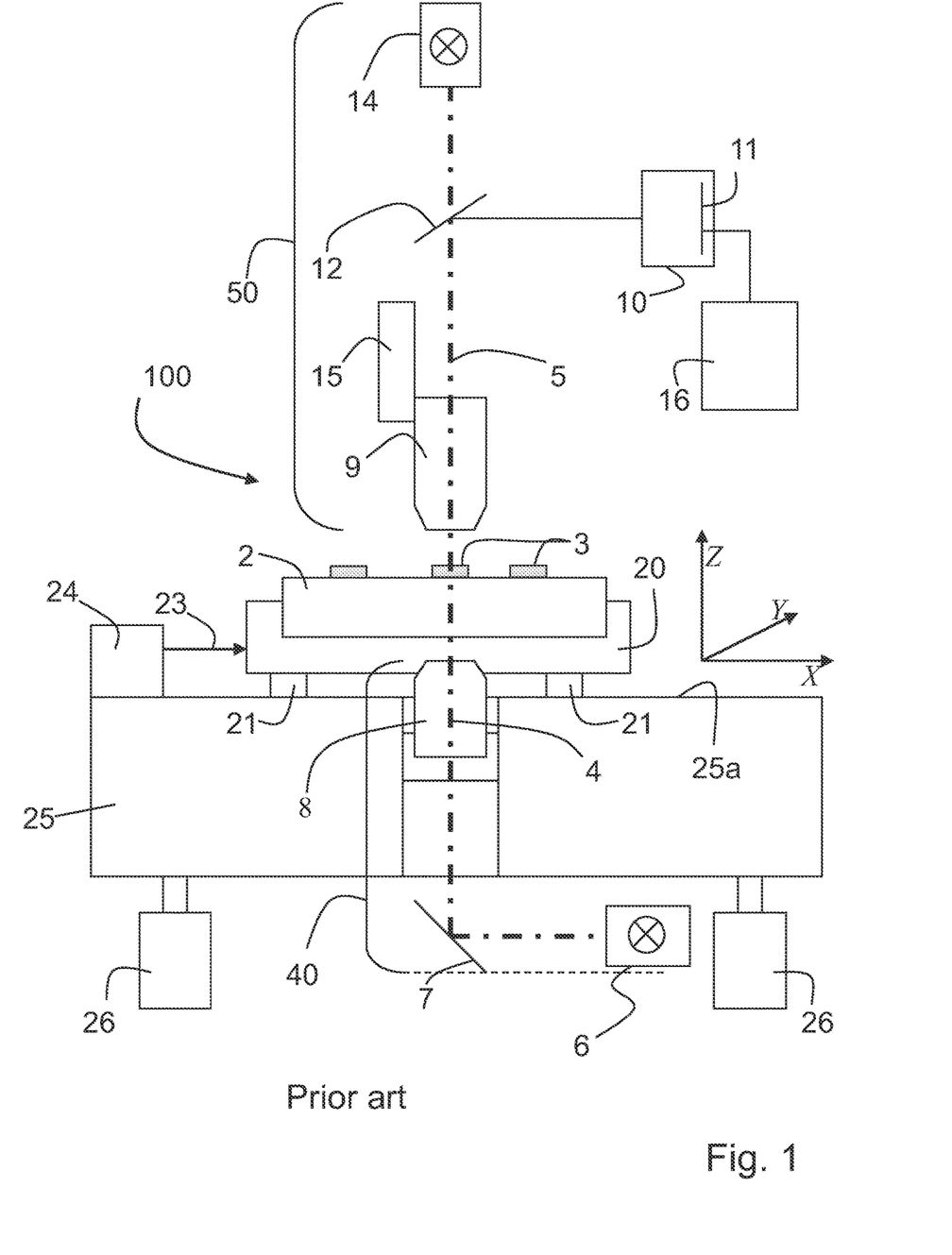
FIG. 1 shows the schematic setup of a prior art metrology tool.

FIG. 1 shows a schematic representation of a coordinate measuring machine or metrology tool 100 as has long been known from the prior art. The metrology tool 100 shown here is only one example of an apparatus which can be used to perform the methods according to the invention. In no way are the methods according to the invention limited to the specific configuration of such a metrology tool shown in the figure. What is important for the inventive methods is that an apparatus is able to perform relative shifts between a mask and a field of view defined by the apparatus, more precisely by an imaging system of the apparatus, that this field of view is such that a plurality of structures on the mask is contained therein, and of course that the apparatus is able to determine the positions of these structures.

A metrology tool 100 is used, for example, for determining the width (CD-critical dimension) of a structure 3 on a substrate 2. Also, using the metrology tool 100, the position of a structure 3 on the substrate 2 can be determined. The substrate 2 may for example be a wafer with a structured surface or a mask exhibiting structures 3 to be transferred to a wafer by a photolithography process. Although the metrology tool 100 shown in FIG. 1 has long been known from prior art, for the sake of completeness, the operation of the metrology tool 100 and the arrangement of the individual elements of the metrology tool 100 will be discussed.

The metrology tool 100 comprises a measuring table 20, which is arranged so as to be displaceable on air bearings 21 in a plane 25*a*, in the X-coordinate direction and in the Y-coordinate direction. For the mounting of the measuring table 20, bearings other than air bearings can also be used. The plane 25*a* is formed from one element 25. In a preferred embodiment, the element 25 is granite. However, to a person skilled in the art, it is obvious that the element 25 can be made from a different material, which provides a precise plane for the displacement of the measuring table 20. The position of the measuring table 20 is measured by means of at least one laser interferometer 24 which, for the measurement, emits a light beam 23 which hits the measuring table 20. From the position of the measuring table 20 the position of the mask 2 can be inferred, in particular the position of the mask 2 relative to a field of view defined by an imaging system of the metrology tool 100. The element 25 itself is mounted on oscillation dampers 26 in order to prevent for example building oscillations reaching the device.

Placed on the measuring table 20 is a substrate 2, for example a mask, which bears the structures 3 to be measured. The substrate 2 can be illuminated with a transmitted light illumination apparatus 6 and/or a reflected light illumination apparatus 14. The transmitted light illumination apparatus 6 is provided in an optical arrangement 40. The reflected light illumination apparatus 14 is also provided in an optical arrangement 50. The optical arrangement 50 comprises the transmitted light illumination apparatus, a deflecting mirror and a condenser. By means of the deflecting mirror, the light from the transmitted light illumination apparatus 6 is directed onto the condenser. The further optical arrangement 50 comprises the reflected light illumination apparatus 14, a beam-splitting mirror 12, the measuring objective 9 and a displacing device 15 assigned to the measuring objective 9. Using the displacing device 15, the measuring objective 9 can be displaced in the Z-coordinate direction (e.g. for focusing). The measuring objective 9 collects light coming from the substrate 2, and the light is then deflected out of the reflected light illumination axis 5 by means of the partially transparent deflecting mirror 12. The light passes to a camera 10 which is provided with a detector 11. The detector 11 is linked to a computer system 16 which generates digital images from the measurement values determined by the detector 11.

Figure 2:
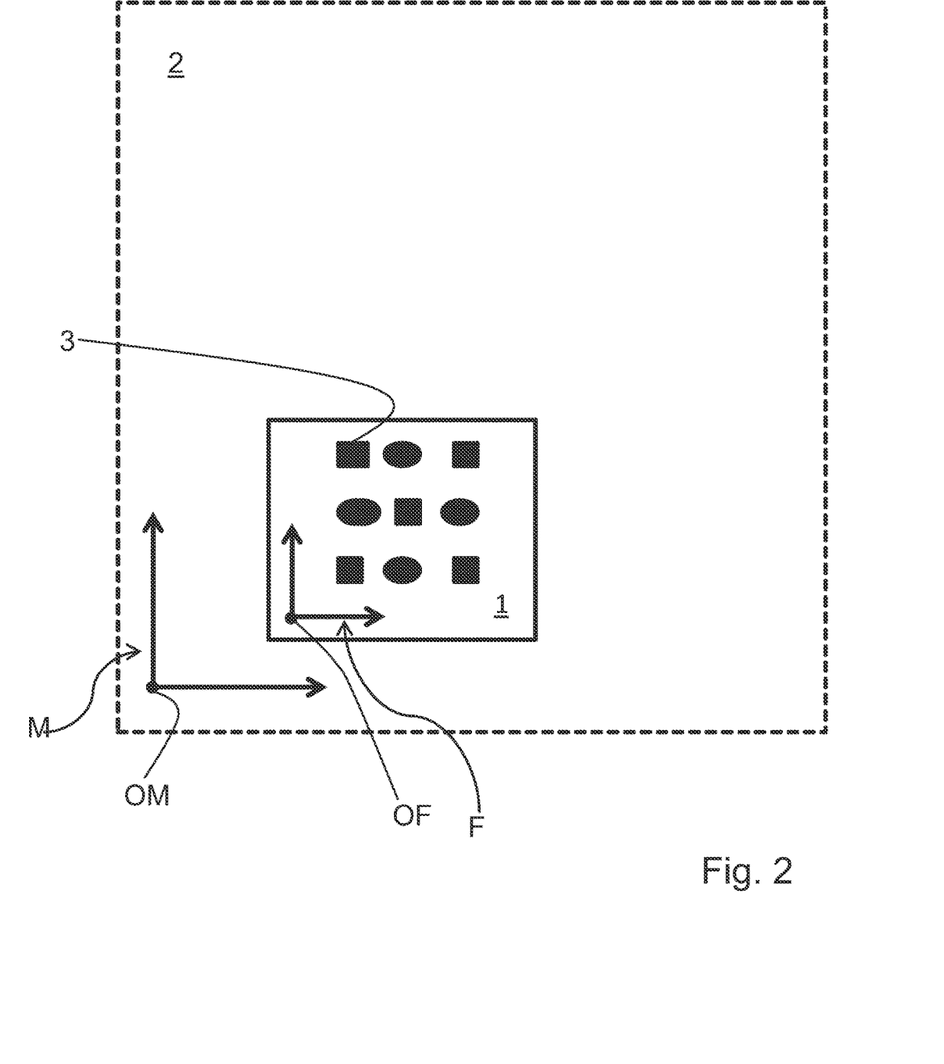
FIG. 2 shows the structures on the surface of a mask in relation to a field of view of an imaging system of a metrology tool.
Figure 3:
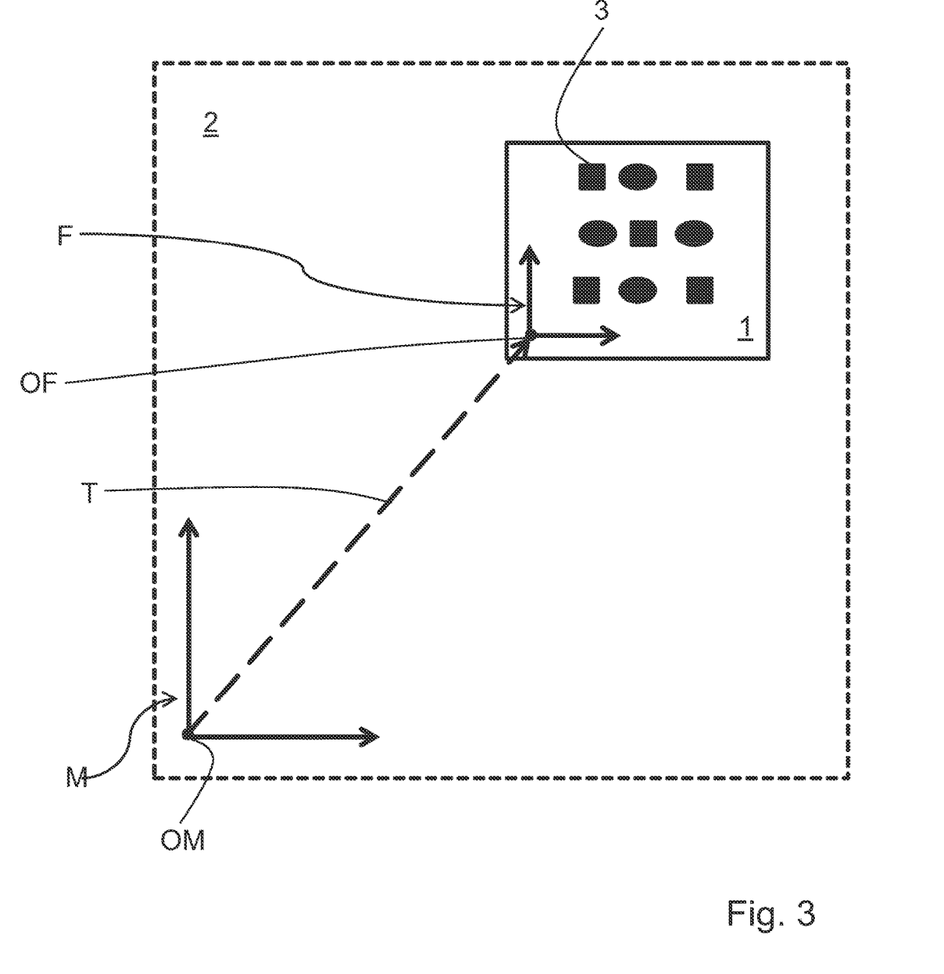
FIG. 3 is analogous to FIG. 2, but for a translation of the mask relative to the field of view.

The optical setup of the metrology tool, in particular the measuring objective 9 and the camera 10 with detector 11, constitute an imaging system defining a field of view 1, as shown in FIGS. 2 and 3.

FIG. 2 shows a field of view 1 as defined by an imaging system of a metrology tool like that described in FIG. 1. A mask 2, exhibiting a plurality of structures 3 on its surface is placed in the field of view 1. The structures may be of the same or different type, and arranged in a regular or irregular fashion. The plurality of structures 3 used in the inventive methods may comprise all the structures on the mask 2 or only a subset. In the figure, only the structures 3 used in the method are shown schematically. With the field of view 1 there is associated a field-of-view coordinate system F with origin OF. With the mask 2 there is associated a mask coordinate system M, with origin OM.

The position of any structure 3 on the mask 2 can be specified relative to the mask 2, i.e., in the mask coordinate system M, where its position is given by two real numbers, Mx and My, say. The position of any structure 3 can also be specified relative to the field of view 1, i.e., in the field-of-view coordinate system F, where its position is given by two real numbers, Fx and Fy, say. Due to the mask placement and mask positioning mechanisms, for example the measuring table 20 of the metrology tool 100 of FIG. 1, the relation between the mask coordinate system M and the field-of-view coordinate system F is known. This allows expressing the position of any structure 3 measured by a metrology tool like that in FIG. 1 either in field-of-view coordinates Fx, Fy or in mask coordinates Mx, My. The true positions of the structures 3 in the mask coordinate system M are fixed, whereas the corresponding positions in the field-of-view coordinate system F change of course, when the mask 2 is shifted relative to the field of view 1.

Due to errors occurring in measurement procedures, the measured mask coordinates Mx, My of a structure 3 may vary depending on circumstances of the measurement. In particular, the measured mask coordinate values Mx, My of a structure 3 will in general depend on the position in the field of view 1 occupied by the structure 3 when its position is measured. When measuring the position of a structure 3, usually first the position of the structure in the field-of-view coordinate system F is determined, as this position, expressed by coordinates Fx and Fy, is the quantity directly accessible via, for example, the image of the field of view 1 recorded by a detector 11 of the mask metrology tool 100, as shown in FIG. 1. From the known relation between the mask coordinate system M and the field-of-view coordinate system F, the measured values Mx, My of the coordinates of the structure in the mask coordinate system M can be derived from the field-of-view coordinates Fx and Fy.

FIG. 3 shows a similar situation as in FIG. 2; most elements shown in FIG. 3 have already been described in FIG. 2. In FIG. 3 the mask 2 has been shifted relative to the field of view 1, in comparison with FIG. 2. The shift is expressed by a translation T of the origin OM of the mask coordinate system M relative to the origin OF of the field-of-view coordinate system F.

According to the methods of the invention, the mask 2 is translated to different positions relative to the field of view 1. In each such relative position the coordinates of the structures 3 in the mask coordinate system M are determined by measurements, as described above. As has also been said above, the true coordinates of the structures 3 in the mask coordinate system M are independent of the position of the mask 2 relative to the field of view 1. Therefore an alignment function correcting the optical errors, which depend on the position in the field of view 1 where a measurement is done, is constructed by steps, described above, which minimize the variation in the measured mask coordinate values Mx and My obtained for one and the same structure 3 when the positions of the structures 3 are measured at different relative positions of the mask 2 and the field of view 1.

Figure 4:
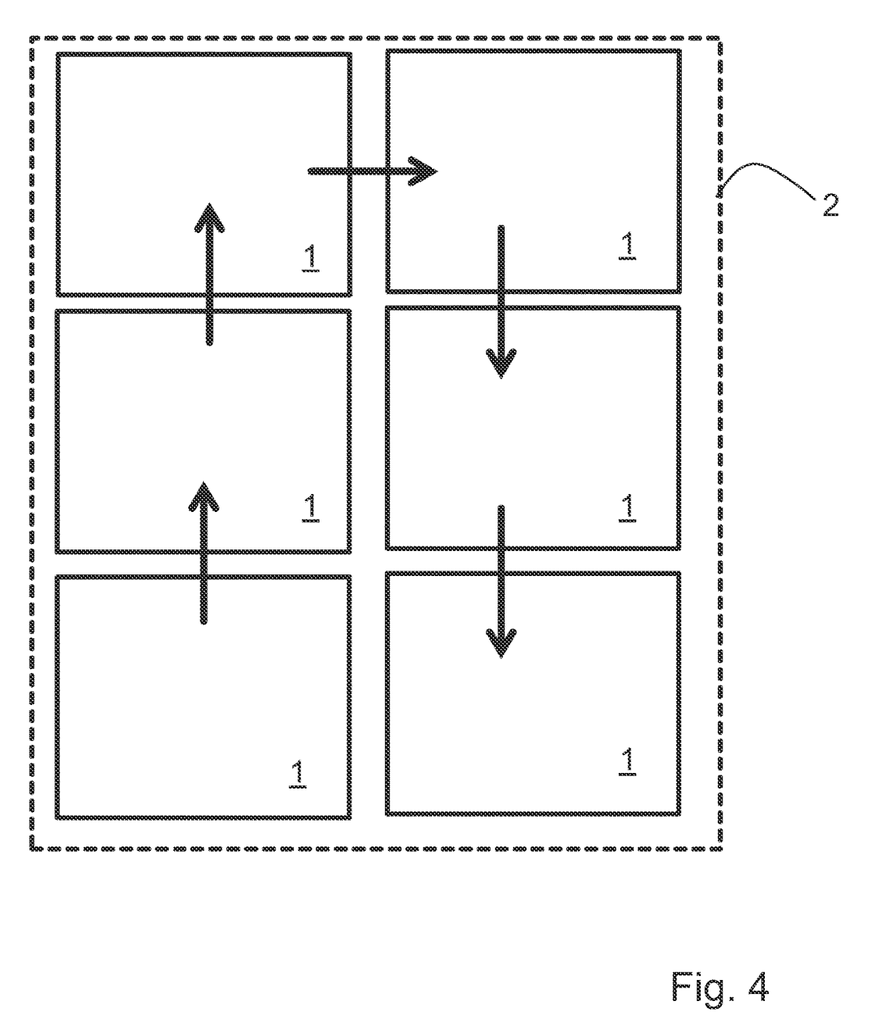
FIG. 4 shows the areas in the field of view successively covered by the mask over the course of successive shifts of the relative position of the mask and the field of view.

FIG. 4 illustrates how, by successive relative shifts, indicated by the arrows, of the mask 2, the field of view 1 is covered to a substantial degree. A high percentage of coverage of the field of view 1 is necessary to determine the alignment function to sufficient precision for the entire field of view 1. The sequence of successive shifts may be chosen before the start of a measurement, taking into account the geometry of the field of view 1 and of the mask 2. It is also possible that in the sequence of such shifts the areas successively occupied by the mask 2 partially overlap. In this way a coverage of the area of the field of view up to 100% can be achieved. For the sake of clarity, structures 3 are not shown on the mask 2 in this figure.

Figure 5:
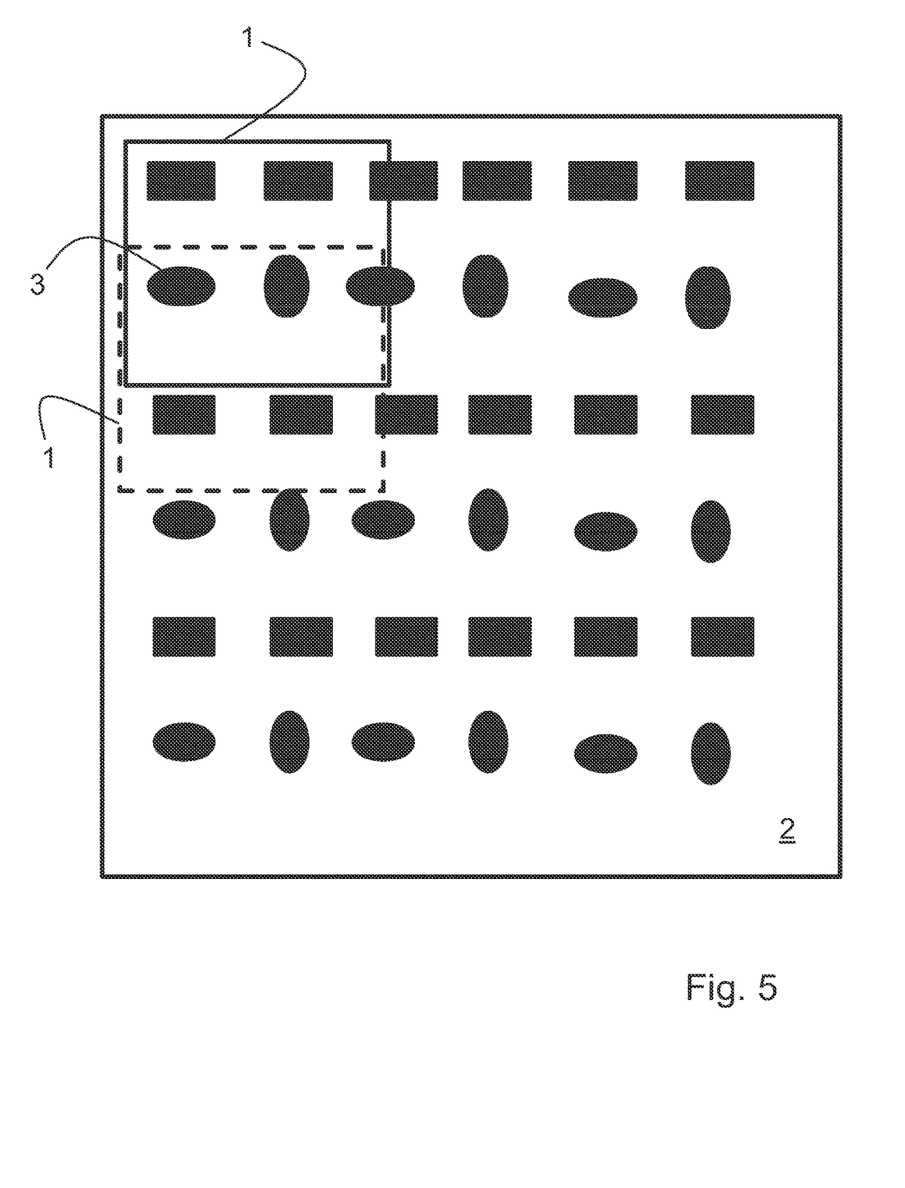
FIG. 5 shows successive relative shifts of a mask and the field of view for a case where the plurality of structures covers an area larger than the field of view.

FIG. 5 illustrates a case where the plurality of structures 3 the positions of which are measured in the inventive methods cover an area larger than the field of view 1. The field of view 1 is shown twice, once in solid line, once in dashed line. These two representations of the field of view 1 correspond to two different relative positions of the field of view 1 and the mask 2, successively assumed according to the inventive methods. The field of view 1 is shown only for two such relative positions, for the sake of clarity; it is of course possible to cover the entire mask 2 in this way. This will be necessary, if mask writer errors for the entire mask are to be identified, for example. The different relative positions of the mask 2 and the field of view 1 here have to be chosen such that at least for the structures 3 to be used in the method the positions of these structures 3 relative to the mask 2 are measured at more than one relative position of the mask 2 and the field of view 1. This requires that, if the field of view 1 is shown on the mask 2 at the corresponding different relative positions with respect to the mask 2, there is an overlap of the representations of the field of view 1, as is indicated here.

Figure 6:
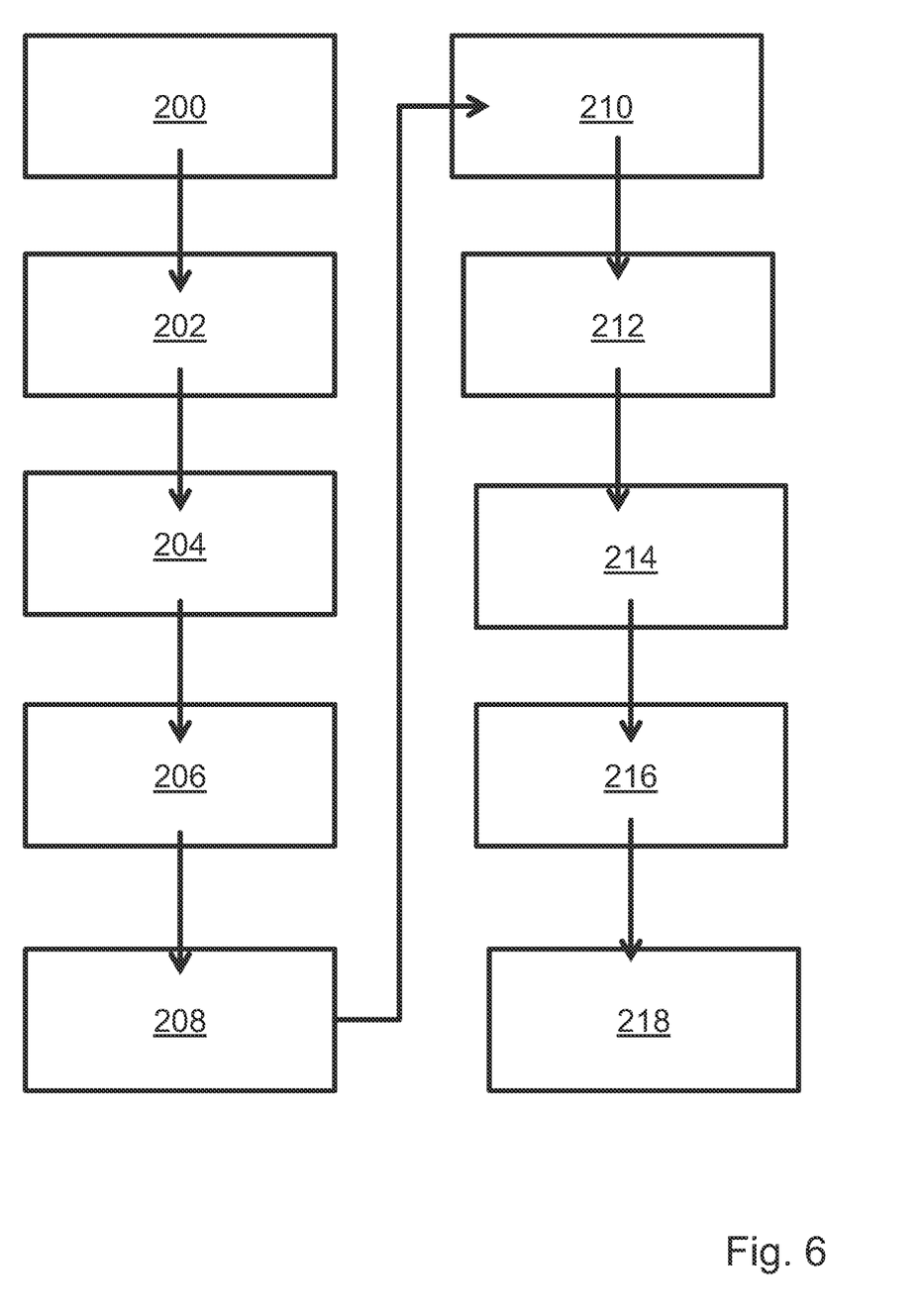
FIG. 6 shows the flow diagram for a specific embodiment of the inventive method to determine mask writer errors.

FIG. 6 shows the flow chart for a particular implementation of the inventive method for identifying mask writer errors. In step 200, a plurality of structures 3 on mask 2 is selected; for this example, the plurality of structures shall comprise a number N of structures. The positions of these structures will be measured repeatedly in the method.

In step 202, one position of the mask 2 relative to the field of view 1 and the N structures to be used are prepared as a job definition for a metrology tool 100. The job definition in this example defines the relative positions of the mask and the field of view in terms of a site on the mask which is to be centered in the field of view. The job definition is, in step 204, passed through a pre-processor, which may be implemented in the metrology tool or on external hardware, usually as software. The pre-processor creates a modified job definition, specifying the N structures to be measured, and a number S of sites on the mask 2 to be successively centered in the field of view 1 of the metrology tool 100. Specifying this number S of sites corresponds to specifying a sequence of shifts of the mask 2 relative to the field of view 1. The modified job definition is output in step 206.

In step 208 the modified job definition is carried out by the metrology tool 100. The results, in step 210, in measurement results for the coordinates of the N structures measured at each of the S relative positions of the field of view 1 and the mask 2. These measurement results are subject to post-processing in step 212. The post-processing can be implemented in the metrology tool 100 or on external hardware. In any case, it is usually implemented in software. The post-processing step 212 determines an alignment function according to the corresponding steps of the method described above, and uses the alignment function to correct the measurement results provided in step 210 for optical errors like distortion and/or aberrations. The results, in step 214, in N corrected positions of structures, each position being specified by two coordinates in the mask coordinate system.

These corrected position values, in step 216, are input to an evaluation process, which determines, for each structure, the deviation between the corrected position, in mask coordinates, of the structure and an ideal position, provided for example as design data of the mask. The deviations obtained this way for the entirety of the N structures then results in a local registration map for the mask 2 in step 218. The local registration map shows the errors of the mask writer used to produce the mask 2 used in the process just described.

The invention has been described with reference to preferred embodiments. It is, however, known to the skilled person that alterations and modifications are possible without leaving the scope of the subsequent claims.

What is claimed is:

1. A method for correcting optical errors occurring in coordinates of positions of a plurality of targets measured via an imaging system comprising a field of view, wherein the plurality of targets comprises a first array of targets and a second array of targets overlapping the first array of targets, and a portion of the plurality of targets are outside of the field of view, the method comprising the following steps:
   a) placing the first array of targets in the field of view of the imaging system, wherein the first array of targets is within the field of view of the imaging system and wherein the relative positions of each target within the first array of targets are fixed;
   b) measuring coordinates of each target within the first array of targets repeatedly via the imaging system, wherein the first array of targets is shifted relative to the field of view of the imaging system between the repeated measurements;
   c) placing the second array of targets in the field of view of the imaging system, wherein the second array of targets is within the field of view of the imaging system and wherein the relative positions of each target within the second array of targets are fixed;
   d) measuring coordinates of each target within the second array of targets repeatedly via the imaging system, wherein the second array of targets is shifted relative to the field of view of the imaging system between the repeated measurements;
   e) determining an alignment function from the measurement results of step b, step d, or steps b and d, the alignment function being a function of coordinates of the field of view of the imaging system and giving an additive correction for optical errors of the coordinates of positions of the plurality of targets measured by the imaging system;
   f) correcting the coordinates of the positions of the plurality of targets measured by the imaging system by adding the respective value of the alignment function at the field-of-view coordinates at which the coordinates of the position of the respective target were measured; and,
   g) obtaining a final result for the position of each target of the plurality of targets by averaging over the corrected coordinates found in step f for the respective target at each relative position of the plurality of targets and field of view of the imaging system.

2. The method of claim 1, wherein a first final result for the coordinates of a position relative to the first array of targets of a respective target is determined by averaging over the results obtained at different relative positions of the first array of targets and the field of view for the coordinates of the position relative to the first array of targets of the respective target, corrected by the alignment function, and a second final result for the coordinates of a position relative to the second array of targets of a respective target is determined by averaging over the results obtained at different relative positions of the second array of targets and the field of view for the coordinates of the position relative to the second array of targets of the respective target, corrected by the alignment function.

3. The method of claim 1, wherein the alignment function is determined in step e such that a variation of the measured positions of the plurality of targets relative to the first and second arrays of targets between the repeated measurements is minimized when these measured positions are first corrected by the alignment function.

4. The method of claim 3, wherein the alignment function is determined by expressing the alignment function as a linear combination of functions, the coefficients of the linear combination being determined such that the variation of the measured positions of the plurality of targets relative to the first and second arrays of targets between the repeated measurements is minimized when these measured positions are first corrected by the alignment function.

5. The method of claim 1, wherein each of the first and second arrays of targets covers an area smaller than the field of view of the imaging system.

6. The method of claim 5, wherein the shifts of each of the first and second arrays of targets are such that the total area covered by each of the first and second arrays of targets over the course of the shifts is more than 85% of the area of the field of view.

7. The method of claim 1, wherein each of the first and second arrays of targets is an arrangement of structures on a substrate.

8. The method of claim 7, wherein each of the first and second arrays of targets is a structured semiconductor wafer.

9. The method of claim 7, wherein each of the first and second arrays of targets is a photolithography mask.

10. The method of claim 1, wherein each of the first and second arrays of targets constitutes a specifically designed test pattern.

11. The method of claim 1, wherein steps b and d are each repeated several times, and all resulting measured coordinates are used for determining the alignment function in step e.

12. The method of claim 1, wherein after step e, the alignment function is stored, and the stored alignment function is applied to correct coordinates of positions of targets measured via the imaging system at a later time, where the correction is achieved by adding the respective value of the alignment function at the field-of-view coordinates at which the coordinates of the position of the respective target were measured.

13. The method of claim 1 wherein at least one of the first and second arrays of targets is shifted relative to the field of view via translational movement.

14. The method of claim 1 wherein the plurality of targets comprises three or more arrays of targets and adjacent arrays of targets overlap, wherein the steps of placing an array of targets in the field of view of the imaging system and repeatedly measuring the coordinates of each target within the array of targets are performed for each additional array of targets, and the step of determining the alignment function is from the measurement results of a single array of targets or a combination of measurement results of a plurality of arrays of targets.

15. A method for detecting photolithography mask writer errors, comprising the following steps:
  a) placing a mask in a field of view of an imaging system of a metrology tool, wherein the mask comprises a plurality of structures, the plurality of structures comprises a first array of structures and a second array of structures overlapping the first array of structures, and a portion of the plurality of structures are outside of the field of view of the imaging system;
  b) measuring the coordinates of the first array of structures on the mask repeatedly with the metrology tool, wherein the mask is shifted relative to the field of view of the imaging system between the repeated measurements;
  c) measuring the coordinates of the second array of structures on the mask repeatedly with the metrology tool, wherein the mask is shifted relative to the field of view of the imaging system between the repeated measurements;
  d) determining an alignment function for the imaging system from the measurement results of step b, step c, or steps b and c, the alignment function being a function of coordinates of the field of view of the imaging system and giving an additive correction for optical errors in the coordinates of the positions of the plurality of structures measured by the metrology tool;
  e) correcting for each structure of the plurality of structures and for each shift of the mask relative to the field of view of the imaging system, the measured position of the respective structure in a mask coordinate system according to the alignment function;
  f) obtaining a final result for the position in the mask coordinate system of each structure of the plurality of structures by averaging over the corrected measured positions in the mask coordinate system found in step e for the respective structure at each relative position of mask and field of view of the imaging system; and
  g) inferring mask writer errors from a comparison between the final results for the positions obtained in step f and design data for the mask measured.

16. The method of claim 15, wherein the mask exhibits mask writer qualification patterns.

17. The method of claim 15, wherein the alignment function is determined in step d such that a variation of measured positions of the plurality of structures relative to the mask between the repeated measurements is minimized when the measured positions are first corrected by the alignment function.

18. The method of claim 17, wherein the alignment function is determined by expressing the alignment function as a linear combination of functions, the coefficients of the linear combination being determined such that the variation of the measured positions of the plurality of structures relative to the mask between the repeated measurements is minimized when the measured positions are first corrected by the alignment function.

19. The method of claim 15, wherein each of the first and second arrays of structures covers an area smaller than the field of view of the imaging system.

20. The method of claim 19, wherein the shifts of the mask are such that the total area covered by each of the first and second arrays of structures over the course of the shifts is more than 85% of the area of the field of view.

21. The method of claim 15, wherein steps b and c are repeated several times, and all resulting measured coordinates are used for determining the alignment function in step d.

22. The method of claim 15 wherein the mask is shifted relative to the field of view via translational movement.

23. The method of claim 15 wherein the mask is shifted relative to the field of view between steps b and c.

24. A method for correcting optical errors occurring in coordinates of positions of a plurality of targets measured via an imaging system comprising a field of view, wherein the plurality of targets comprises a first array of targets and a second array of targets overlapping the first array of targets, and a portion of the plurality of targets are outside of the field of view, the method comprising the following steps:

a) placing the first array of targets in the field of view of the imaging system, wherein the first array of targets is within the field of view of the imaging system and wherein the relative positions of each target within the first array of targets are fixed;

b) measuring coordinates of each target within the first array of targets repeatedly via the imaging system, wherein the first array of targets is shifted relative to the field of view of the imaging system between the repeated measurements;

c) placing the second array of targets in the field of view of the imaging system, wherein the second array of targets is within the field of view of the imaging system and wherein the relative positions of each target within the second array of targets are fixed;

d) measuring coordinates of each target within the second array of targets via the imaging system with a single measurement;

e) determining an alignment function from the measurement results of step b, step d, or steps b and d, the alignment function being a function of coordinates of the field of view of the imaging system and giving an additive correction for optical errors of the coordinates of positions of the plurality of targets measured by the imaging system;

f) correcting the coordinates of the positions of the plurality of targets measured by the imaging system by adding the respective value of the alignment function at the field-of-view coordinates at which the coordinates of the position of the respective target were measured; and, g) obtaining a final result for the position of each target of the plurality of targets by averaging over the corrected coordinates found in step f for the respective target at each relative position of the plurality of targets and field of view of the imaging system.

25. A method for correcting optical errors occurring in coordinates of positions of a plurality of targets measured via an imaging system comprising a field of view, wherein the plurality of targets comprises a first array of targets and a second array of targets non-overlapping with the first array of targets, and a portion of the plurality of targets are outside of the field of view, the method comprising the following steps:

a) placing the first array of targets in the field of view of the imaging system, wherein the first array of targets is within the field of view of the imaging system and wherein the relative positions of each target within the first array of targets are fixed;

b) measuring coordinates of each target within the first array of targets repeatedly via the imaging system, wherein the first array of targets is shifted relative to the field of view of the imaging system between the repeated measurements;

c) placing the second array of targets in the field of view of the imaging system, wherein the second array of targets is within the field of view of the imaging system and wherein the relative positions of each target within the second array of targets are fixed;

d) measuring coordinates of each target within the second array of targets repeatedly via the imaging system, wherein the second array of targets is shifted relative to the field of view of the imaging system between the repeated measurements;

e) determining an alignment function from the measurement results of step b, step d, or steps b and d, the alignment function being a function of coordinates of the field of view of the imaging system and giving an additive correction for optical errors of the coordinates of positions of the plurality of targets measured by the imaging system;

f) correcting the coordinates of the positions of the plurality of targets measured by the imaging system by adding the respective value of the alignment function at the field-of-view coordinates at which the coordinates of the position of the respective target were measured; and, g) obtaining a final result for the position of each target of the plurality of targets by averaging over the corrected coordinates found in step f for the respective target at each relative position of the plurality of targets and field of view of the imaging system.

\* \* \* \* \*